United States Patent [19]

Risko

[11] Patent Number: 4,482,860
[45] Date of Patent: Nov. 13, 1984

[54] CAPACITANCE MEASUREMENT PROBE
[75] Inventor: Donald G. Risko, Monroeville, Pa.
[73] Assignee: Extrude Hone Corporation, Irwin, Pa.
[21] Appl. No.: 486,807
[22] Filed: Apr. 19, 1983

Related U.S. Application Data

[63] Continuation-in-part of Ser. No. 329,943, Dec. 11, 1981, Pat. No. 4,422,035, which is a continuation-in-part of Ser. No. 215,737, Dec. 12, 1980, abandoned.

[51] Int. Cl.$^3$ ............................................. G01R 27/26
[52] U.S. Cl. .................................................. 324/61 P
[58] Field of Search ................ 324/61 P, 61 R, 61 QS

[56] References Cited

U.S. PATENT DOCUMENTS 2,543,570  2/1951  Eder ................................. 324/61 R
3,710,244  1/1973  Rauchwerger .................... 324/61 R

FOREIGN PATENT DOCUMENTS 818345   12/1959  United Kingdom .
1282962  7/1972   United Kingdom .
2050608  7/1981   United Kingdom .

Primary Examiner—Stanley T. Krawczewicz
Attorney, Agent, or Firm—Fidelman, Wolffe & Waldron

[57] ABSTRACT

An improved probe is provided for surface texture capacitive gauging. One embodiment of the probe comprises a sensor assembly with a thin, flexible dielectric having a conductive coating to provide an active sensor area and integral lead-in which is durable, flexible, and constant. In another embodiment, a bladder-like flexible dielectric contains a conductive media and the bladder is appropriately confined to define the active sensor area. The probe includes a mask to further define the active sensor area and to sense proper seating of the probe on the work surface to be gauged.

15 Claims, 48 Drawing Figures

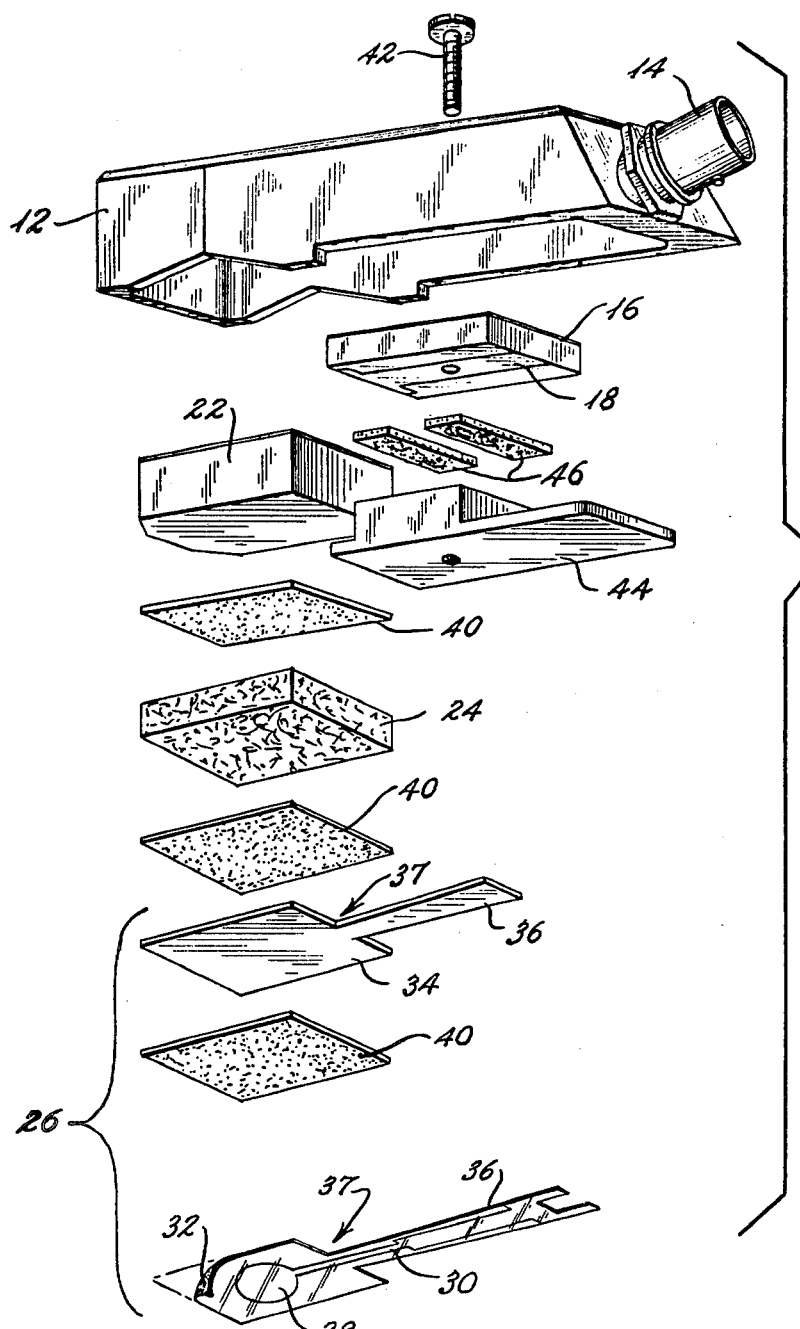
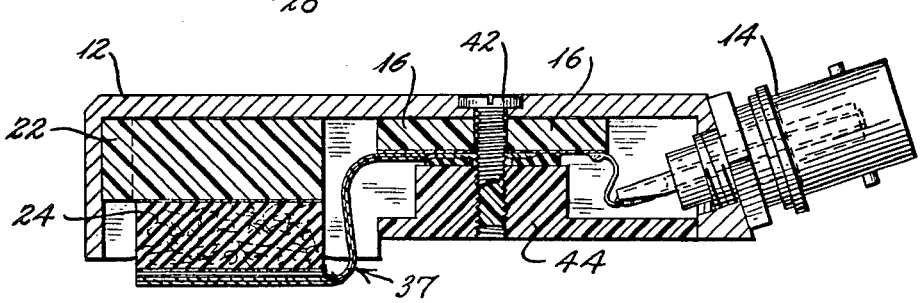

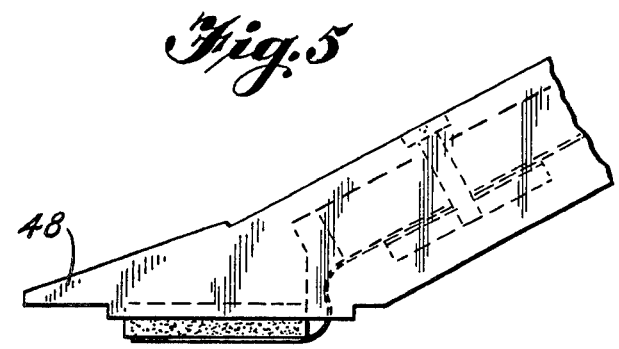
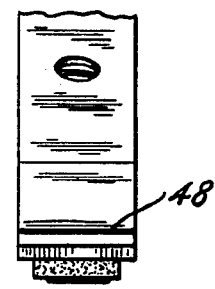
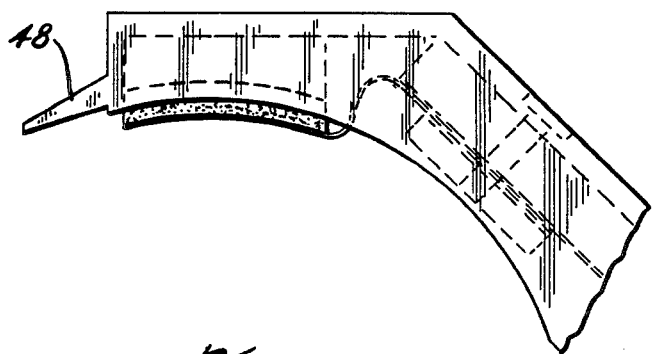
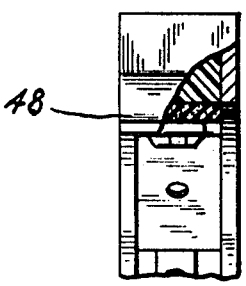
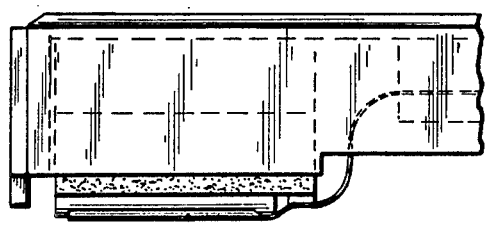
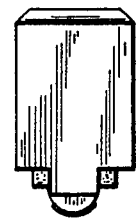
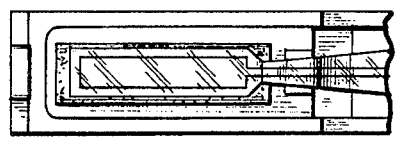

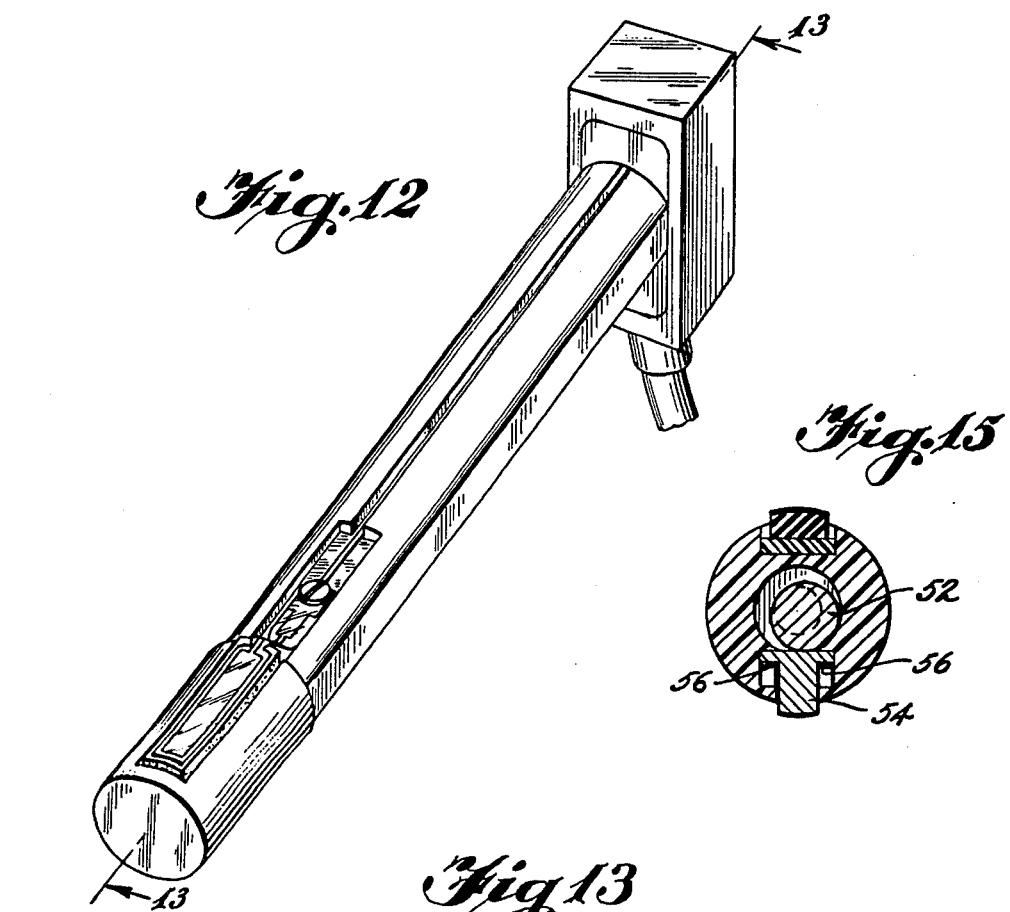

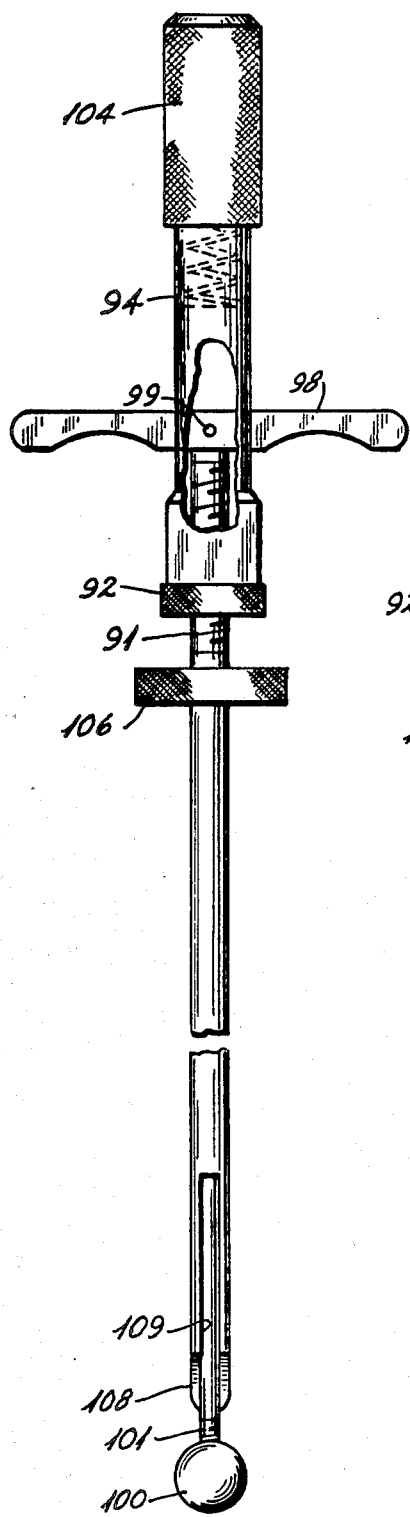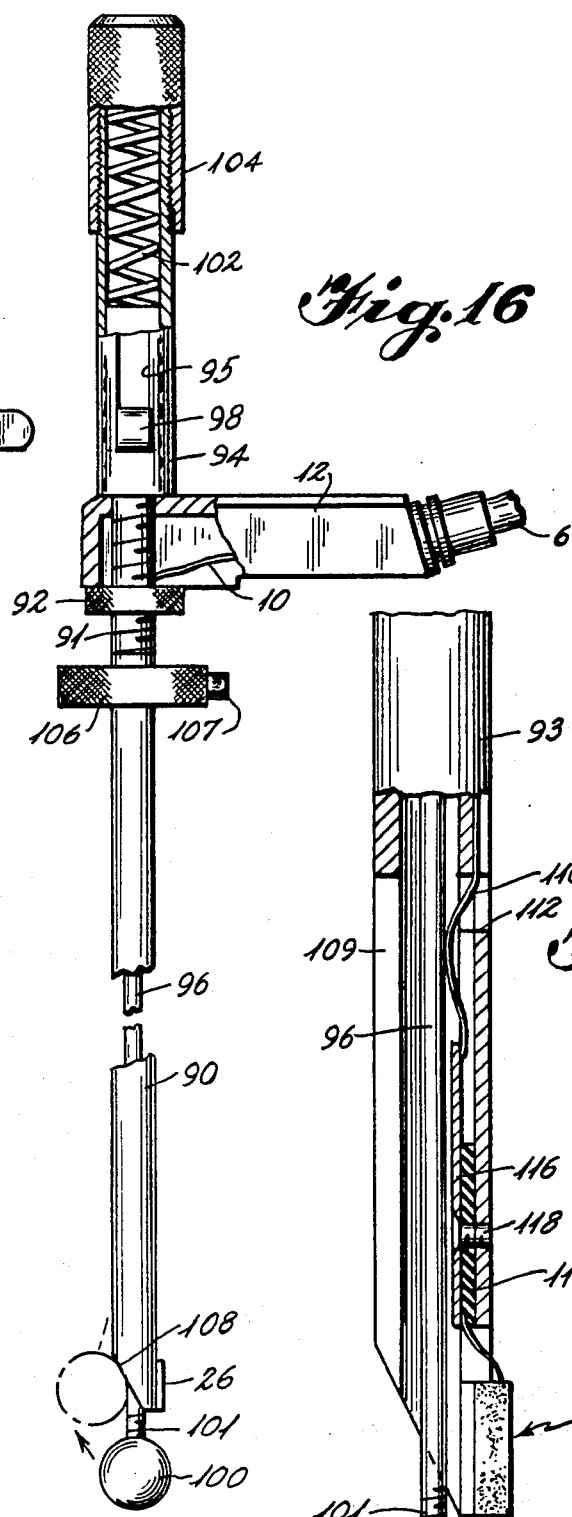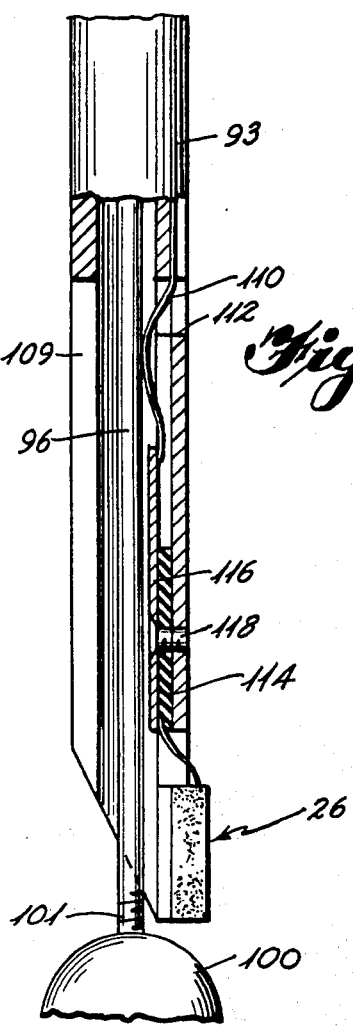

SURFACE TEXTURE

SURFACE WAVINESS

SURFACE ROUGHNESS

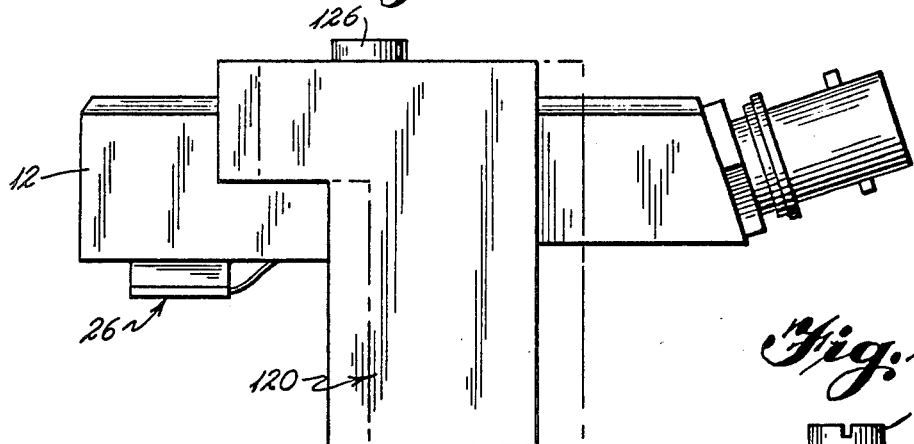
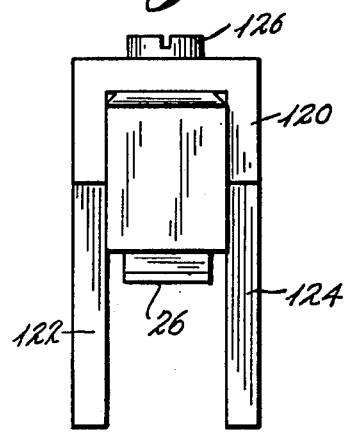
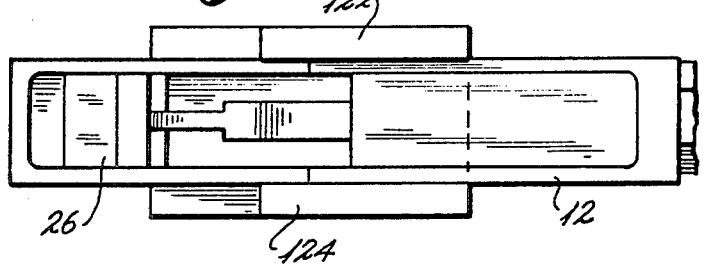
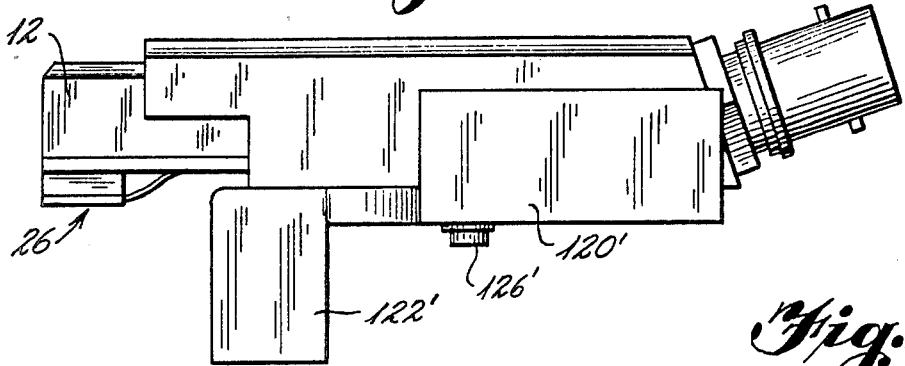
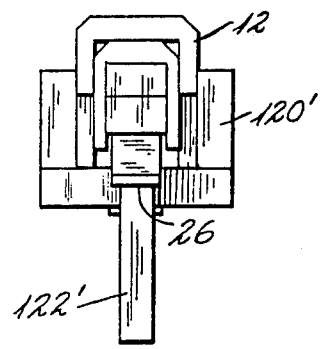
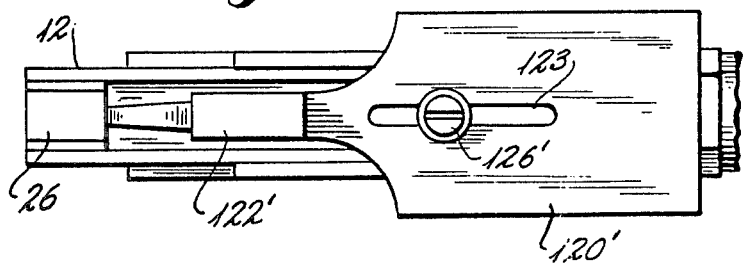

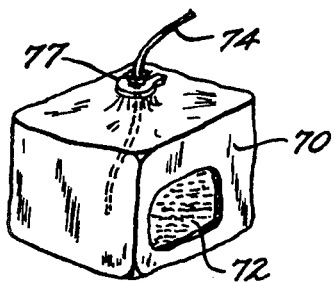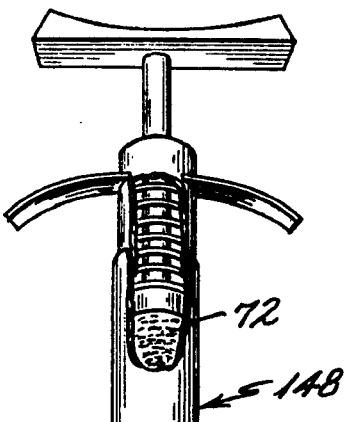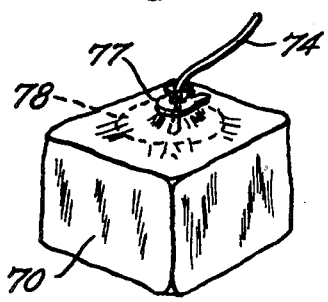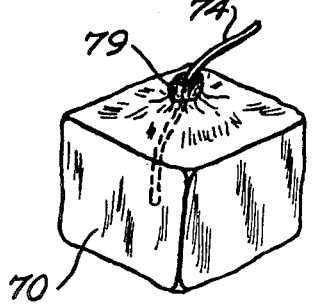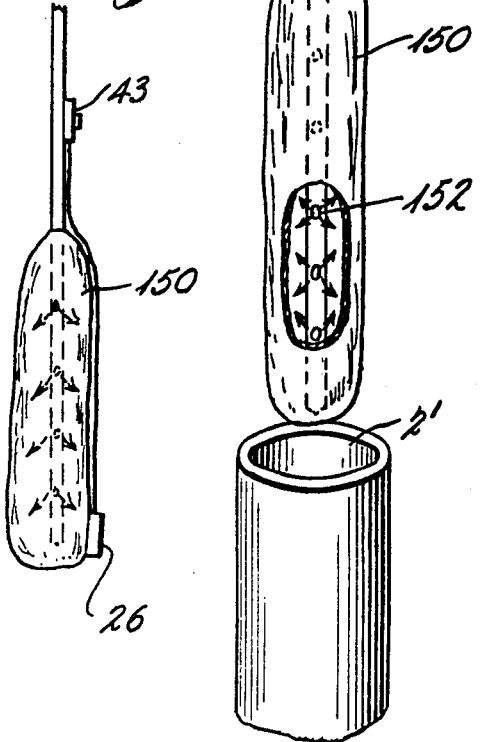

CAPACITANCE MULTIPLIER

ANALOG/DIGITAL CONVERTER

CAPACITANCE MEASUREMENT PROBE

This application is a continuation-in-part (CIP) of U.S. application Ser. No. 329,943 filed Dec. 11, 1981, now U.S. Pat. No. 4,422,035 which, in turn, is a CIP of U.S. application Ser. No. 215,737 filed Dec. 12, 1980 (now abandoned).

BACKGROUND OF THE INVENTION

1. Field of the Invention

This invention relates to capacitance gauging for the direct measurement of surface texture.

2. Description of the Prior Art

U.S. Pat. No. 4,103,226, "APPARATUS FOR GAUGING THE TEXTURE OF A CONDUCTING SURFACE"—Fromsen, et al., and U.S. Pat. No. 4,130,796, "CALIBRATING AND MEASURING CIRCUIT FOR A CAPACITIVE PROBE-TYPE INSTRUMENT"—Shum provides detailed descriptions of an electronic instrumentation package that may be used with the probe of the instant invention. The disclosures of these patents are hereby incorporated by reference.

The invention is in the field of surface texture measurement, as more fully described in the American National Standard publication, SURFACE TEXTURE, ANSIB46.1-1978, published by the American Society of Mechanical Engineers, the contents of which are herein incorporated by reference.

Surface texture includes waviness, roughness (superposed on waviness), lay, and flaws; it is the repetitive of randon deviations from an intended (nominal) surface finish and is generally associated with surfaces produced by such means as abrading, casting, coating, cutting, etching, plastic deformation, sintering, wear, erosion, and the like. For purposes of this disclosure, a glossary of terms (similar to those provided in the above publication) are listed as follows:

Waviness is the more widely spaced component of surface texture. Unless otherwise noted, waviness is to include all irregularities whose spacing is greater than that designated as surface "roughness". Waviness may result from such factors as machine or work deflections, vibration, chatter, heat treatment or warping strains.

Roughness consists of the finer irregularities of the surface texture, usually including those irregularities which result from the inherent action of the production process. These are considered to include transverse feed marks (such as caused by lathes) and other irregularities of the work surface. Roughness may be considered superposed on a "wavy" surface.

Lay is the direction of the predominant surface pattern, ordinarily determined by the production method used.

Flaws are unitentional irregularities which occur at one place or at relatively infrequent or widely varying intervals on the surface. Flaws include such defects as cracks, blow holes, inclusions, checks, ridges, scratches, etc.

A peak is the point of maximum height on that portion of a profile which lies above the centerline and between two intersections of the profile and the centerline.

A valley is the point of maximum depth on that portion of a profile which lies below the centerline and between two intersections of the profile and the centerline.

Roughness Average Value ($R_a$) may be obtained when using stylus-type measurement instruments. It is the arithmetic average of the absolute values of the measured profile height deviations within a sampling length and measured from the graphical centerline, as the stylus moves relative to the surface being tested. With the probe of the instant invention, capacitive measurement is made of volume deviations of a sampled surface area, such that three-dimensional surface "voids" correspond to the previously defined two-dimensional "valleys". Hence, for purposes of this disclosure, an average three-dimensional surface assessment is obtained which corresponds to the two-dimensional $R_a$.

For a fuller understanding of these terms, one may refer to the drawings.

A gauging system for surface texture which is based upon capacitance should include a probe that allows the active sensor area, acting as one plate of a capacitor, to conform to the surface (acting as the other plate of the capacitor) being assessed. For accuracy, this active sensor area should be spaced from the conductive surface by a fixed thickness of dielectric insulation. The probe should provide sensor rigidity such that the active sensor area does not settle into the "valleys" of the surface, while also providing a means of connection between the active sensor area and the probe output point which does not change in capacitance and/or resistance.

3. Problems with Prior Art Apparatus

The probe of U.S. Pat. No. 4,103,226 is exemplary of the prior art in which problems with accurate measurement repeatability have been detected. In one probe, wire leads are connected to the backs of sensor plates and are run through or around a nonconductive foamed elastomer backing for the plates and then threaded through an opening in a casing for connection to an electronic instrumentation package. The leads of this probe are fragile and present some difficulty when replacement of the sensor portion (a "wear" item) is necessary. The fragile connections between the leads and sensor plates are subject to damage during sensor replacement. In another probe, the sensor plates are secured (as by a conductive adhesive) to a conductive elastomer backing with contacts. An insulating material (non-conductive elastomer) spaces the contacts and conductive elastomer from each other and from the casing; and leads are run from the contacts, through the insulating material and casing, for connection to the electronic instrumentation package. Again, connection fragility and replacement difficulty have been encountered. Proper use of the probe depends on a uniform distribution of the forces normal to the sensor plates when the probe is pressed to the workpiece. The two different materials (insulating material and conductive elastomer) present problems of relative movement, such as shifting, to redistribute these normal forces and produce a pressure gradient, which greatly affects the measurement results.

These two prior art probes have an additional problem in common. The insulated spacing of the contact plates and the workpiece is provided by a dielectric which is attached to the face of each plate by an adhesive. In practice, adhesive tape, such as common "scotch tape", is applied to the face of each plate to act as the adhesively attached dielectric. For stable, predictable, repeatable measurements, the distance between the sensor plates and the workpiece must be constant over the whole area of the active sensor. Adhesives can and do flow and redistribute. For instance, when "scotch tape" has been used as the adhesively attached dielectric, heat and/or stress has caused the adhesive to flow and redistribute so that the distance between the contact plates and the workpiece has varied over the area of the plates and has affected greatly the accuracy of the surface texture measurement. Also in practice, it has been found that the edges of the sensor plates can cut into the dielectric, causing the nuisances and inaccuracies of adhesive sticking to the workpiece.

Other problems encountered in the prior art probes involve system interconnection. These probes are connected to an instrumentation package, usually by a coaxial cable. Because the cables have an inherent capacitance which is directly proportional to the cable length, it has been preferable to reduce this capacitance by reducing the length of the cable. Additionally, small changes in the capacitance of the cable can adversely affect the system when gauging or measuring surface texture in which even smaller changes in the capacitance need to be measured.

Usually, prior to measuring the texture of a particular work surface, the system is calbrated on a reference surface which may not have the exact radius of curvature of the workpiece. According to the size and shape and conformability of the active sensor area, greater or lesser active sensor area may be presented to the reference surface than to the work surface, so that an incorrect measurement results.

Although prior art probes have been provided with flexible active sensor areas, they have not been sufficiently flexible to adequately and easily conform to three-dimensional curvatures, as in work surfaces having compound radii of curvature. With prior art devices for gauging a surface characteristic by capacitive coupling, a variation of capacitance is sensed as the probe approaches the work surface prior to proper seating of the probe on the work, and no means for sensing this proper seating prior to commencing the gauging has been provided.

An object of the instant invention is to provide a surface texture measurement probe in which the distance between the active sensor area and the workpiece will remain constant with repeated use.

Another object of the instant invention is to provide a secure electrical connection between the active sensor area and the electronic instrumentation to reduce or eliminate changes in capacitance and resistance.

A further object of the instant invention is to provide a probe without the above-mentioned problems of normal force pressure redistribution.

Still further, it is an object of this invention to provide an easily replaceably, less fragile sensor portion for a surface texture measurement probe whereby duplication of resistance and capacitance characteristics are obtainable with a high degree of certainty.

Additionally, it is an object of the instant invention to provide a probe in which a flexible active sensor is thin enough (on the order of several angstroms) to eliminate the "cutting edge" effect, while providing a secure, predictable connection between it and the electronic instrumentation.

It is a further object of the invention to reduce or eliminate from the system the adverse effects of changes in the inherent capacitance of coaxial cable, while enabling use of cables of greater length.

An additional object of the invention is to provide a means for electrically masking a portion or portions of the sensor to define a particular active sensor area configuration.

Another object of the invention is to provide a method and means for sensing proper seating of a gauging probe with a conductive work surface which is flat or has a compound curvature, and to commence gauging a predetermined characteristic of the surface only after proper seating has been accomplished and sensed.

Further, an object of the instant invention is to provide an active sensor area which more easily and adequately conforms to the work surface.

These and other objects will become readily apparent from the following disclosure.

SUMMARY OF THE INVENTION

An improved probe and method of use is provided for gauging the texture or finish of a conductive surface by a capacitive measuring system. The measuring system uses the capacitance developed, between a reference electrode or active sensor area of fixed area and a portion of the conductive surface being evaluated, as a measure of the texture of the subject surface. The measurement is an area assessment of the surface and is made quickly and easily. An instrumentation package to which the probe is attached is calibrated to give texture values equivalent to stylus-measured roughness values on machined surfaces without chatter marks. The probe is designed to be pressed against the surface until the complete active sensor area is properly positioned on the surface and includes a sensor assembly with a thin flexible dielectric having a conductive coating acting as one plate of a capacitor. In one embodiment using capacitor grade aluminum coated MYLAR, the aluminum is altered by etching techniques to provide a durable sensor for repeatably accurate measurments without the capacitance and resistance changes inherent in prior art probes.

In another embodiment of the invention, proper seating of the gauging apparatus on the work surface is detected prior to commencement of the gauging.

DESCRIPTION OF THE DRAWINGS

FIG. 3 is an exploded view of one embodiment of the probe of the instant invention.

FIG. 4 is a cross-section of the probe of FIG. 1, taken along lines 4—4.

FIGS. 5, 7, and 9 are side elevations of alternate embodiments of the probe of the instant invention.

FIGS. 6, 8, and 10 are, respectively, front elevations of FIGS. 5, 7, and 9.

FIG. 11 is a bottom plan view of FIG. 9.

FIG. 12 is an isometric of an alternate embodiment of the probe, used for gauging an internal bore surface.

FIG. 13 is a cross-section of the probe of FIG. 12, taken along lines 13—13.

FIG. 14 is a top plan view of the sensor assembly of FIG. 12.

FIG. 15 is a cross-section of FIG. 13, taken along lines 15—15.

FIG. 16 is a side elevation of an alternate embodiment of an internal bore probe.

FIG. 17 is a front elevation of the probe of FIG. 16.

FIG. 18 is an enlarged view, partially in section, of the tip of the bore probe of FIG. 16.

FIGS. 24, 27, and 30 are side elevations of probes similar to that of FIG. 1 to which guides or depth collars have been added.

FIGS. 25, 28, and 31 are, respectively, front elevations of FIGS. 24, 27, and 30.

FIGS. 26, 29, and 32 are, respectively, bottom plan views of FIGS. 24, 27, and 30.

FIGS. 39–41 illustrate various methods of anchoring conductive leads to flexible bags.

FIG. 42 is a front elevation, partially in section, illustrating a bore probe incorporating a flexible non-conductive bag with a flowable conductive medium therein.

FIG. 43 is a partial view of a bore probe, similar to that of FIGS. 16–18, in which an inflatable bag is used to apply pressure to the active sensor.

Like numerals designate similar basic elements throughout the drawings.

DETAILED DESCRIPTION OF THE INVENTION

Figure 19:
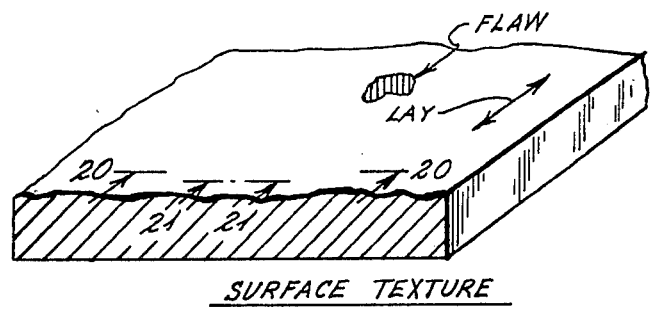
FIGS. 19–21 are respectively greater enlargements of a portion of the workpiece surface to be measured.
Figure 20:
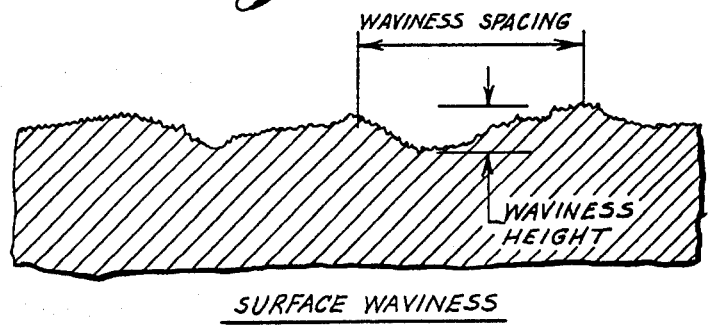
Figure 21:
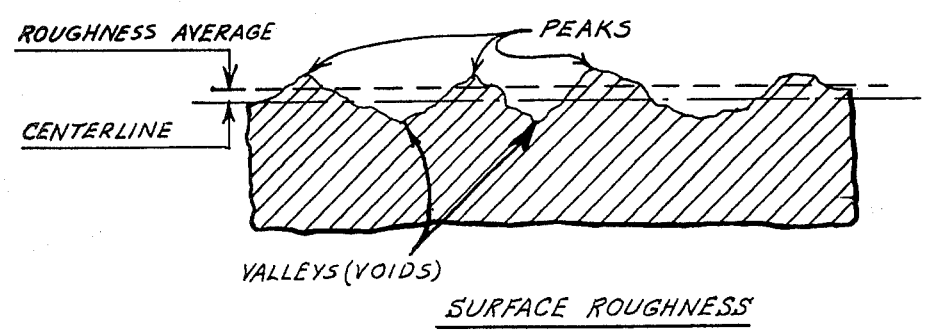

By referring to FIGS. 19–21, and the earlier provided glossary of terms, a better understanding may be gained of this field of measurement. In FIG. 19, a portion of work surface 2 (of FIG. 1) is enlarged to indicate flaw, lay, and the general contour of interest. FIG. 20 is a further enlargement of a portion of the profile of the work surface of FIG. 19, illustrating the texture waviness. FIG. 21 is an even further enlargement of a portion of the profile of FIG. 19 to illustrate the peaks and valleys of roughness superposed on the waviness of the work surface texture.

Figure 1:
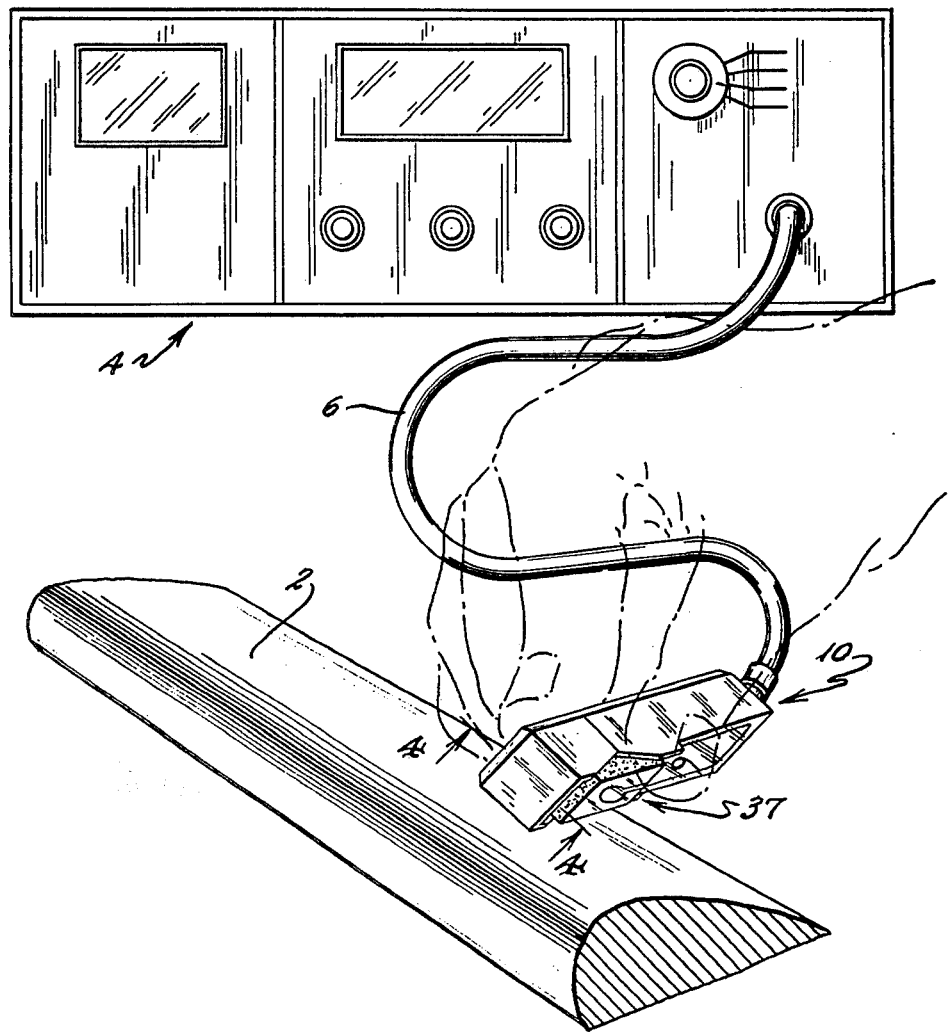
FIG. 1 depicts the environment of use of the improved probe of the instant invention.

Referring to FIG. 1, probe 10 is used to gauge the surface texture of the workpiece 2 and is connected by coax cable 6 to an instrumentation package 4 of the type described in U.S. Pat. Nos. 4,103,226 and 4,130,796.

Figure 2:
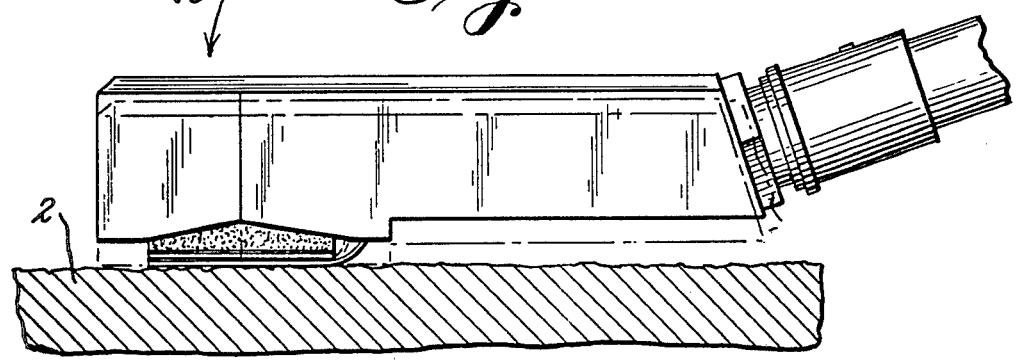
FIG. 2 is a side elevation of the probe of FIG. 1, with the measurement position of the probe indicated in phantom lines.

Referring to FIGS. 2 and 3, probe 10 includes a conductive casing 12 with coax connector 14. Attached to the inside of casing 12 is insulating contact block 16 having a conductive contact strip 18. Contact strip 18 is connected to coax connector 14, as by soldered wire 20. Also attached to the inside of casing 12 is a solid block 22 of nonconductive, hard plastic or the like. A nonconductive elastomer pad 24 is mounted on block 22; sensor assembly 26, in turn, is attached to pad 24. Block 22 provides the support means and the rear pressure surface configuration required for proper "seating" of the sensor 28 on the surface to be assessed.

Sensor assembly 26 comprises a flexible dielectric, uniformly deposited or coated with a conductive material. Aluminium coated MYLAR is readily available and is commonly used in wound capacitors. By well-known etching techniques, the aluminum surface may be reduced to the surface area needed to define active sensor 28 and integral lean-in 30. To protect active sensor 28 and lead-in 30, a backing 34 is provided. Thin adhesive pads 40 may be used for connecting these various parts, although other means of attachment, such as thermal fusing, may be used.

Backing 34, which may be a material such as MYLAR, dictates the flexibility or stiffness of the sensor assembly 26 and provides electrical insulation. The stiffness or flexibility of backing 34 is dictated by the surface finish to be gauged and the degree of measurement desired for that surface. To include the peaks and valleys of roughness into the measurement, a very flexible backing 34, or no backing at all, is required. To include the texture waviness into the measurement, while not including the peaks and valleys of texture roughness, backing 34 needs to be stiffer to prevent sagging of sensor 26 into the valleys. To perform a rougher measurement of the surface, without including the texture waviness, an even stiffer backing 34 is needed. A relatively high degree of stiffness is generally used for assessing very rough surfaces, whereas a low degree of stiffness is generally used on sensor assemblies for assessing surfaces with finer finishes.

Dielectric 32, lead-in 30, and backing 34 are provided with a "tail" 36 for attachment of sensor assembly 26 to contact block 16. "Tail" 36 is necked-down as at 37 so that when sensor assembly 26 is mounted on the probe, as in FIG. 4, it will bend away from the elastomer pad 24 more sharply while also bending in the same place every time.

To demonstrate the advantage of necked-down portion 37 of tail 36, one can bend a rectangular piece of paper while grasping opposite ends of it and pushing them toward each other. Repeating this exercise, one can see that the bend will not be always in the same place. Now, by cutting away portions of this same piece of paper to provide a generally necked-down tail as in the sensor assembly and by repeating the bending exercise, one can demonstrate a reduced radius of curvature at the bend which always occurs at the same place.

Referring to FIGS. 3 and 4, tail portion 36 of electrical insulative backing 34 is shorter than tail portion 36 of the rest of the sensor assembly 26 to allow a bare end of conductor 30 to make electrical contact with contract strip 18. Nylon screw 42 slidably fits through casing 12 and contact block 16 and is threaded into a pressure plate 44 of nylon, plastic, or the like. By positioning "tail" 36 as in FIG. 4 and threading screw 42 into plate 44, the base portion on the tail of lead-in 30 is forced into contact with strip 18 to effect electrical connection between sensor assembly 26 and instrumentation package 4. Small elastomer pads 46 may be attached to pressure plate 44 to insure smooth electrical contact in spite of any lack of surface flatness on top of plate 44. The arrangement at contact block 16 allows easy, dependable electrical connection of the sensor assembly during repair or replacement.

The configuration of the probe is adaptable to flat or convex surfaces, with FIGS. 5 and 7 disclosing extensions 48 for applying pressure with one's hand when workpiece interference does not allow application of pressure to casing 12 directly above sensor assembly 26. FIGS. 9-11 illustrate a probe for use on small radius, internal surfaces.

In use, the probe body or casing is pressed into contact with the workpiece surface and capacitive sensor 28 is firmly held against the surface by a nonconductive elastomer cushion 24. This allows the sensor to accurately measure the surface texture in terms of a capacitance value which is transmitted to the electronic circuitry of the instrumentation package for conversion into the desired measurement units and digital and/or graphically display. Referring again to FIGS. 1-4, the probe casing 12 provides electrically grounded shielding. If a separate connection is not made to the workpiece away from the surface to be assessed, casing 12 provides the electrical contact that is required in most cases to establish surface 2 as the "other" capacitance surface. The portion of casing 12 in the area surrounding the sensor assembly 26 also provides a mechanical stop such that a limited, fixed pressure can be applied between the sensor 28 and the surface to be assessed. For repair or replacement, sensor assembly 26 and pad 24 are removed as a unit from block 22.

FIGS. 12, 13, and 15 disclose an alternate embodiment of probe 10 which is easily inserted into a bore to gauge the internal surface texture thereof. FIG. 14 is an enlarged top plan view of the sensor assembly 26 of FIGS. 12 and 13. A rotatable rod 40 runs the length of probe 10 and has an eccentric 52. When rod 50 is rotated, eccentric 52 bears against a presser foot 54 to urge it to the position of FIG. 15 (into engagement with the inner surface of the bore which is opposite that of the sensor assembly 26). A leaf spring arrangement 56 biases presser foot 54 toward eccentric 52.

FIGS. 16-18 illustrate another type of bore probe. Utilizing the same basic casing 12 of the probe of FIG. 1, an additional coaxial cable 110 (smaller than coax 6) extends down a groove 93 in the external surface of a sensor tube 90. Cable 110 is then threaded through a hole 112 to the inside of tube 90 for connection to sensor assembly 26, via contact plate 116 which is spaced from tube 90 by insulating contact block 114. The threaded end of tube 90 passes through the upper portion of casing 12, with retainer 92 and actuator housing 94 having internal threads for cooperation with threads 91 of tube 90 to capture casing 12 therebetween. Threaded through tube 90 is a relatively stiff cable 96 which has a ball 100 attached to the lower end thereof by threads 101 or the like. Attached to the upper end of cable 96 is a T-shaped handle 98 by a set screw or the like 99. Actuator housing 94 has an internal spring 102 which is forced into engagement with the upper end of handle 98, directly or via an extender block, and is retained within actuator housing 94 by housing cap 104. Slots 95 in actuator housing 94 accommodate the horizontal portions of handle 98, with an additional slot for access to set screw 99.

The lower end of tube 90 also has a ramped portion 108 and a slot 109 such that pulling up on handle 98 will cause ball 100 to ride up ramp 108 for engagement with the opposite side of a bore that is to be measured by sensor assembly 26. Slot 109 allows the end of cable 96 to slightly protrude from the side of tube 90 so that a larger internal bore may be accommodated. To set the depth within which it is desired to measure the internal surface of a bore, a slidable depth stop 106 is provided with a thumb screw 107 for adjustably positioning it along tube 90.

Figure 22:
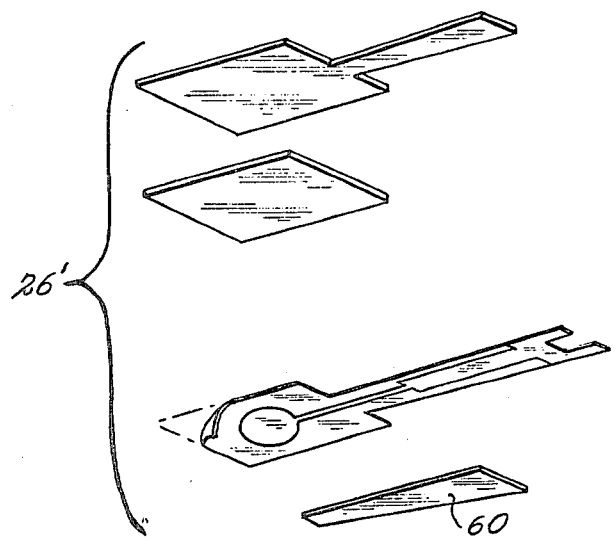
FIG. 22 is an exploded view of an alternate sensor assembly having a mask.
Figure 23:
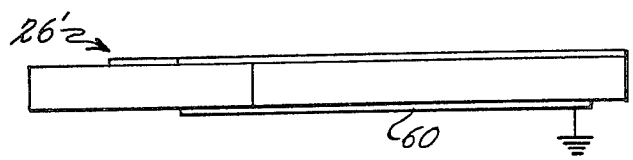
FIG. 23 is a view, along the edge of a portion of the sensor assembly of FIG. 22, illustrating the arrangement of a masking coating on the work surface engaging side of the dielectric and the active sensor conductive coating on the other side thereof.

Referring to an alternate embodiment in FIGS. 22 and 23, sensor assembly 26' includes a mask 60 which may be formed in the same manner and of the same material as the conductive coating of sensor assembly 26. This coating is sufficiently homogeneous as to prevent scratches in the work surface. When using a reference surface for calibration of the measurement system, the radius of curvature of the reference surface may be larger than that of the workpiece surface to be gauged. In such an instance, more of "tail" 36 may enter into calibration of the system than into measurement of the work surface, resulting in an incorrect gauging of the work surface. By electrically insulating conductive mask 60 from the conductive coating which forms active sensor 28 and tail 36, and by connecting mask 60 to casing 12, the effect of tail 36 is electrically masked during calibration and measurement. Accordingly, such an error in measurement will not occur.

Figure 33:
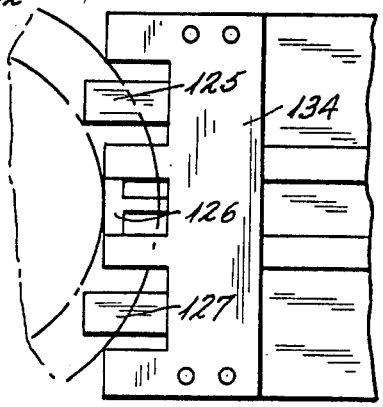
FIGS. 33 and 34 illustrate the use of the depth collar of the probe of FIGS. 30–32.
Figure 31:
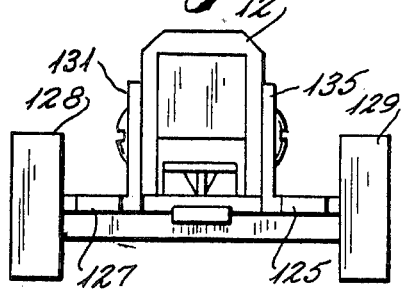
Figure 34:
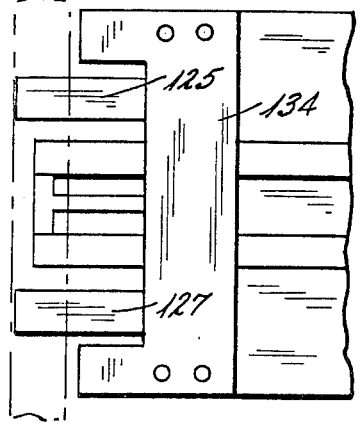

For facilitating the measurement of different surfaces, various guides are attachable to the probes, as illustrated in FIGS. 24-34. In FIGS. 24-26, a generally U-shaped outside diameter guide 120 straddles probe 12 and has depending leg portions 122 and 124. A machine screw 126 allows adjustment along the length of casing 12 as illustrated by the phanton-line position of the guide in FIG. 24. In use, a round rod or the like (workpiece) whose outer diameter is to be measured or gauged would be positioned such that its longitudinal axis would be perpendicular to the length of the casing 12, and guide 120 would be adjusted along the length of casing 12 until sensor assembly 26 is positioned properly for the measurement on the outside diameter of the workpiece. Referring to FIGS. 27-29, another type of outside diameter guide 120' is attached to the bottom of casing 12 by a machine screw 126' and has a slot 123 for adjustment of casing 120' along the length of casing 12 much the same as that of FIGS. 24-26. The guide 120' has only one depending leg portion 122' which guides the probe when used with narrow access outside diameters. FIGS. 31-34 disclose another type of guide for use with the probe when the internal surface of a groove must be gauged. Referring to FIG. 31, L-shaped brackets 131, 135 are attached to the sides of casing 12 as by screws 132. Connecting web 134 has depth collars 128 and 129 on opposite ends thereof, with these collars each having a slot 130 for reception of a portion of L-shaped brackets 131, 135. Set screws 136 allow adjustment of the depth collars relative to L-shaped brackets 131, 135 so that the stop portions 125, 127 of L-shaped brackets 131, 135 may extend more or less into a groove of a surface, as illustrated in FIGS. 33 and 34. The sensor assembly 126 is mounted on a very thin surface protruding from the front of casing 12 and in line with stops 125, 127 such that the sensor assembly may reach into a groove.

Figure 35:
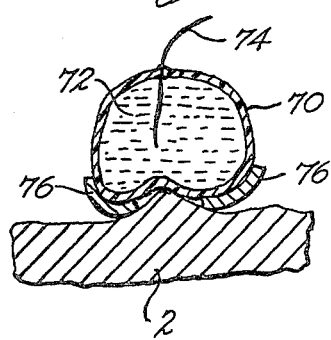
FIGS. 35 and 36 are partial cross-sections of additional embodiments incorporating a flowable conductive medium.
Figure 36:
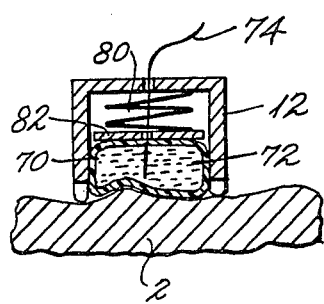
Figure 30:
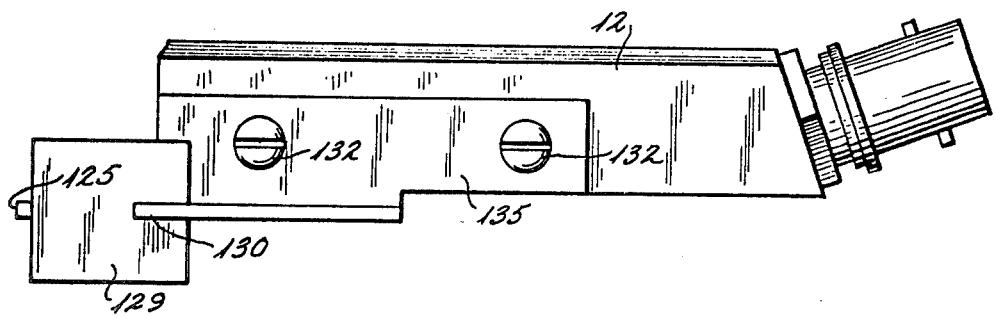
Figure 32:
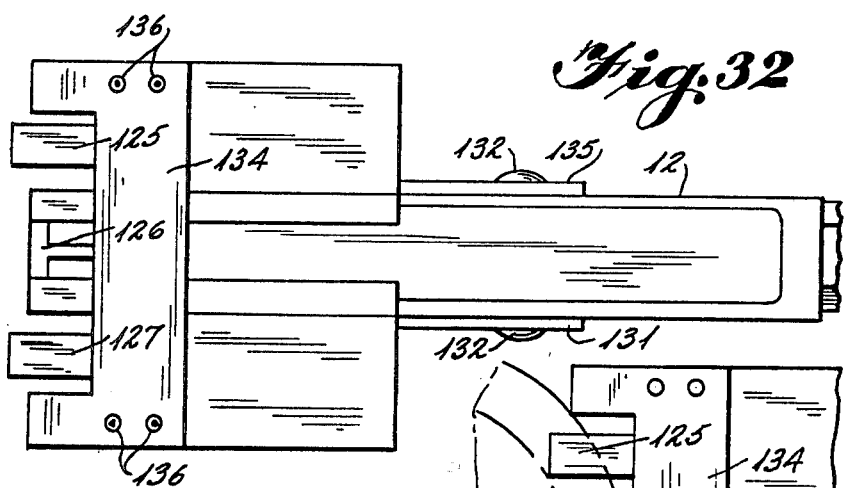

Other alternate embodiments for the probe are disclosed in FIGS. 35 and 36, in which a conductive medium 72 is contained in a sack or bladder 70, with an electrical lead 74 providing signal connection to the coaxial cable. A mask 76, similar to coating 60 of FIGS. 22 and 23, has an opening facilitating contact of bladder 70 with the work surface 2 and defining the active sensor area of the probe. In FIG. 36, probe casing 12 partially confines bladder 70 while allowing the active sensor area to contact work surface 2. Lead 74 extends through washer-like member 82 and a hole in probe case 12, with spring 80 providing biasing so that the exposed, active sensor area may better conform to the work surface 2. The bladder 70 is a dielectric material such as latex, plastic, or the like; and conductive medium 72 may be a gas, although a fluid (such as mercury), gel (as used with EGG patient leads), or powder (such as small metal particles) is thought to be a better medium for these embodiments. The particular material used for bladder 70 will depend upon the amount of flexibility or stiffness desired, as in the previous discussion on the flexibility of backing member 34. Of course, the mask 76 of FIG. 35 may be provided on the probe of FIG. 36.

Figure 37:
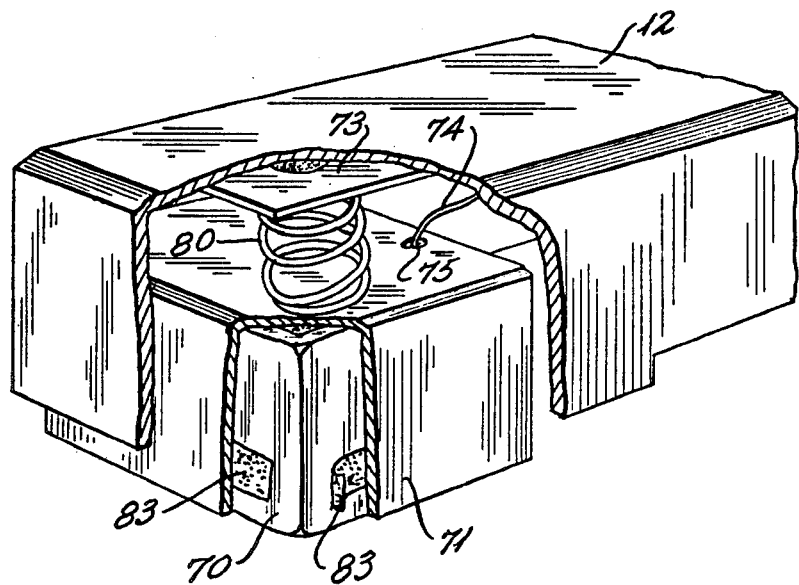
FIG. 37 is an isometric view, partially in section, of a probe which is similar to that of FIG. 36.
Figure 38:
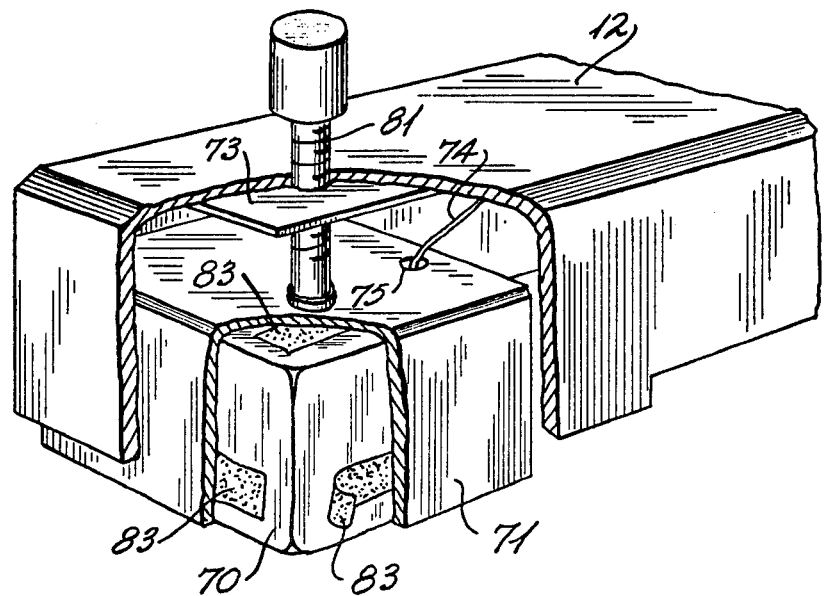
FIG. 38 is an isometric view, partially in section, of an alternate embodiment of the probe of FIG. 37.

As seen in FIGS. 37 and 38, the probe casing 12 may include a five-sided carrier 71 within which flexible (but non-expansible) bag 70 is secured as by adhesive strips 83. Carrier 71 has an access hole 75 through which conductive lead 74 passes to the flexible bag 70. Spring 80 is attached between carrier 71 and a plate 73 of casing 12 as by welding, soldering, or the like. Referring to FIG. 38, carrier 71 (and hence sensor bag 70) may be adjustable toward and away from the work surface by threaded member 81 which is threaded into casing 12 and has a rotatable connection with carrier 71. It is further contemplated that a fixed or adjustable stop (not shown) may be attached to case 12 of FIG. 37 so that carrier 71 is limited in the amount that it may retract into case 12.

FIGS. 39-41 illustrate various means for providing a good connection of conductive lead 74 to flexible bag 70. In FIG. 39, a clip 77 securely holds bag material 70 around conductive lead 74 which extends into conductive medium 72. In FIG. 40, clip 77 is used again to provide a secure connection between bag 70 and lead 74, with the additional provision of a conductive coating 78 on the internal surface (or a portion thereof) of bag 70 providing the conductive link between the incoming lead and the contained conductive material. In FIG. 41, lead 74 again passes into bag 70 and is held in position therein by an adhesive or ultrasonic bonding or the like as at 79.

An alternative embodiment of the flexible bag/conductive medium-type of probe is partially illustrated in FIG. 42, in which a syringe-like member 48 has holes 152 in the tip thereof and a flexible bag 150 attached thereto. Conductive medium 72 is sucked up into the cylinder of the syringe prior to insertion of the probe into the bore 2' whereupon the plunger of the syringe is used to force the conductive medium down the tip of the syringe and into the bag 152 to expand it into engagement with the internal surface of the workpiece. Of course, the necessary electrical lead between the conductive medium and the coaxial cable may be attached through the cylinder of the syringe or may be attached through the wall of the bag or the like.

In FIG. 43, flexible bag 150 may have the sensor assembly 26 (as in FIGS. 16-18) instead of the conductive medium 72. As will be readily understood, the syringe will then just pump air or the like into bag 150 to compress sensor assembly 26 into engagement with the internal surface of the bore. The means for attachment of sensor assembly to the electronic circuitry will be evident from the foregoing figures.

In FIGS. 42 and 43, bags 150, in addition to being flexible, may or may not be expansible. Of course, in using the bore probe of FIG. 42, it is preferable to use an exact master reference surface and a regulator or meter for repeatability of the pressure applied to the conductive medium so that the surface texture measurements will be consistent. As will be appreciated, the flexible bag-conductive medium-type of probe has the advantage of conforming more easily to compound curvatures.

Figure 44:
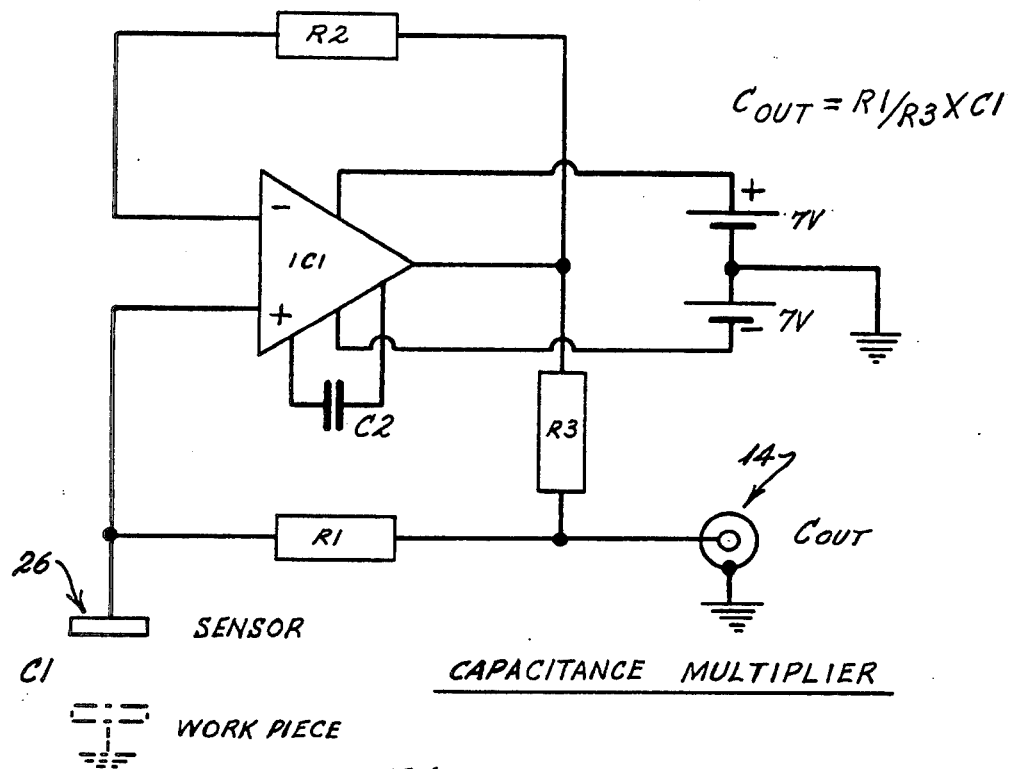
FIG. 44 is a schematic of a capacitive multiplier circuit which may be incorporated into various ones of the probes in which the measurement signal is small relative to the capacitive effects of the coaxial cable.

When the active sensor area of the above-described probes is diminished, as for measuring a very small area of texture surface or one of compound radii, the capacitive effects of the coaxial cable may be greater than the changing capacitance that one is trying to measure. Accordingly, the signal information (those capacitive changes that one is trying to measure) may be magnified or amplified prior to transmission on the coaxial cable so that the desired information may be separated more easily from the capacitive changes of the coaxial cable in the instrumentation package. FIG. 44 discloses a capacitance multiplier by which this may be accomplished.

Figure 45:
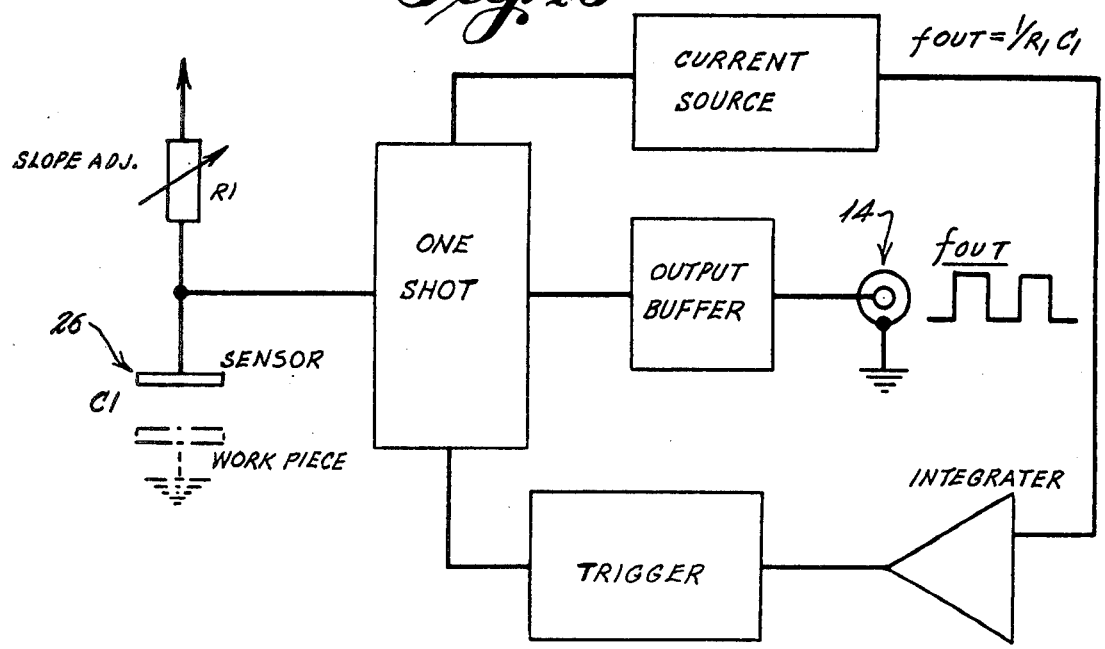
FIG. 45 is a block diagram illustrating an A/D converter that may be incorporated into the probe to eliminate unwanted signal noise and to eliminate the need for a "coaxial" cable.

Because the capacitance of the coaxial cable is directly proportional to the length of the cable, a fixed cable length has been a necessity in the past. Additionally, as indicated above, it is sometimes difficult to differentiate between the capacitive changes of the coax cable and those capacitive changes which one is trying to measure. Accordingly, circuitry may be added to the probe for converting the analog signal to a digital signal prior to transmission on the coaxial cable so that digital data is transmitted to a decoding and display circuitry in the instrumentation package. In effect, this eliminates undesired capacitive effects and allows use of a cable (not necessarily coaxial) of any length. Additionally, a fibre optics cable may be used in this application. One such circuit which may be incorporated into the probe is illustrated in FIG. 45.

Figure 46:
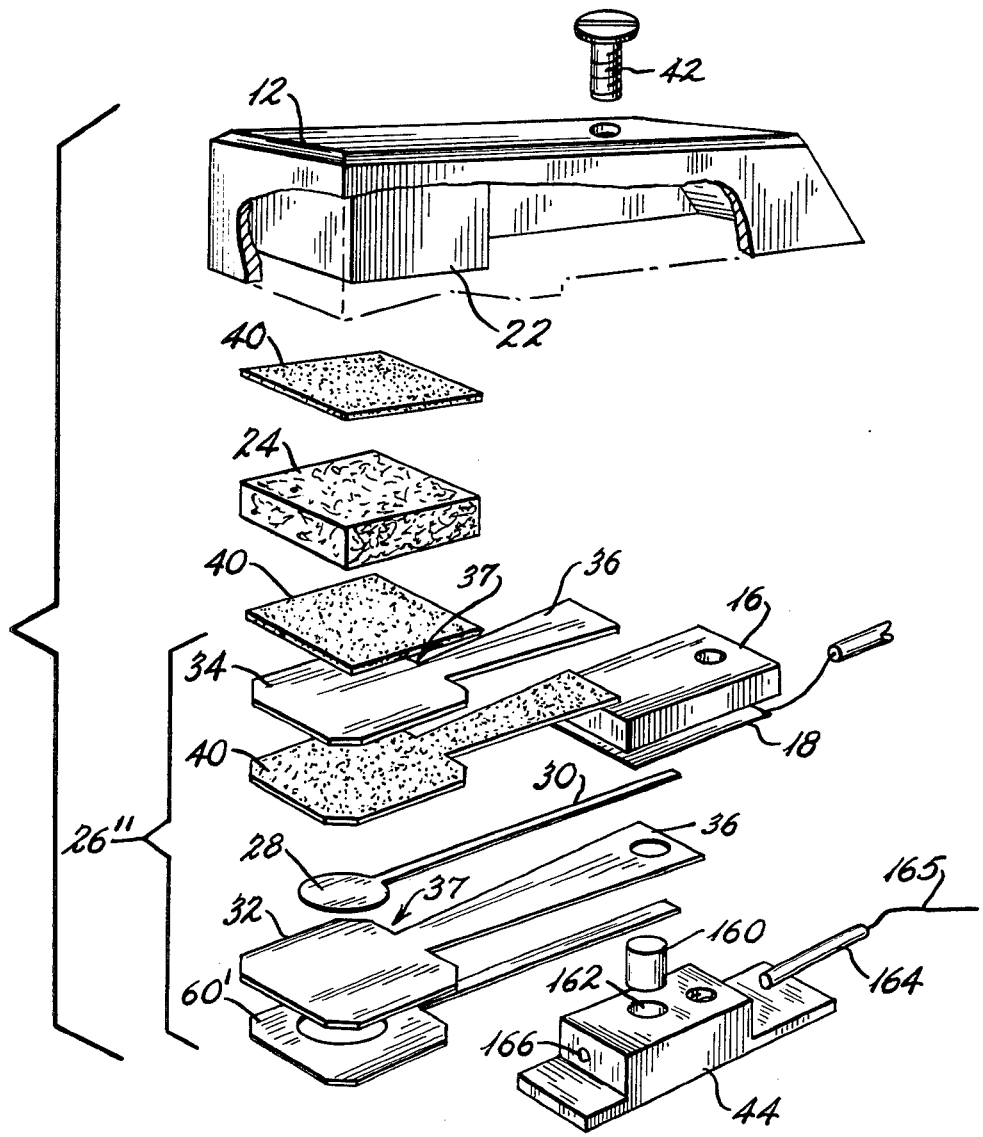
FIG. 46 is an exploded view, similar to FIG. 3, of an alternate embodiment of the instant invention.
Figure 47:
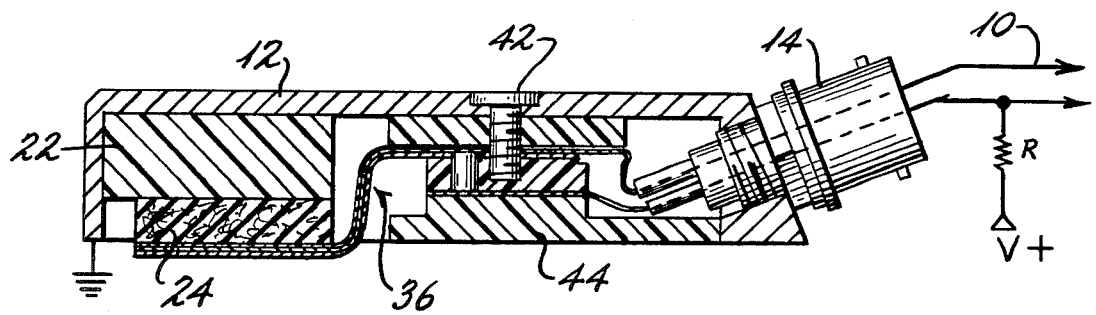
FIG. 47 is a cross-section of the probe of FIG. 46.

FIGS. 46 and 47 illustrate an apparatus for use in still another embodiment of the instant invention. The device of 46 is very similar to that of the previously described FIG. 3 and includes the additional features of a mask 60' similar to that of FIGS. 22 and 23 which is connected via conductive elastomer plug 160 to an additional lead 165. Non-conductive pressure plate 44 is provided with a hole 162 for reception of conductive elastomer plug 160, and hole 162 intersects with hole 166 which receives a connecting pin 164 attached to lead 165 so that an electrical connection is completed between mask 60' and lead 165. As shown schematically in FIG. 47, mask 60' is connected through pull-up Resistor to a positive voltage (such as 5 volts DC) so that, upon proper placement of the probe onto the work surface, a ground (via case 12 as indicated in 47 or via a ground which is attached to the work surface) will complete the circuit to provide an indication that the probe is properly seated and gauging of the surface should commence.

Figure 48:
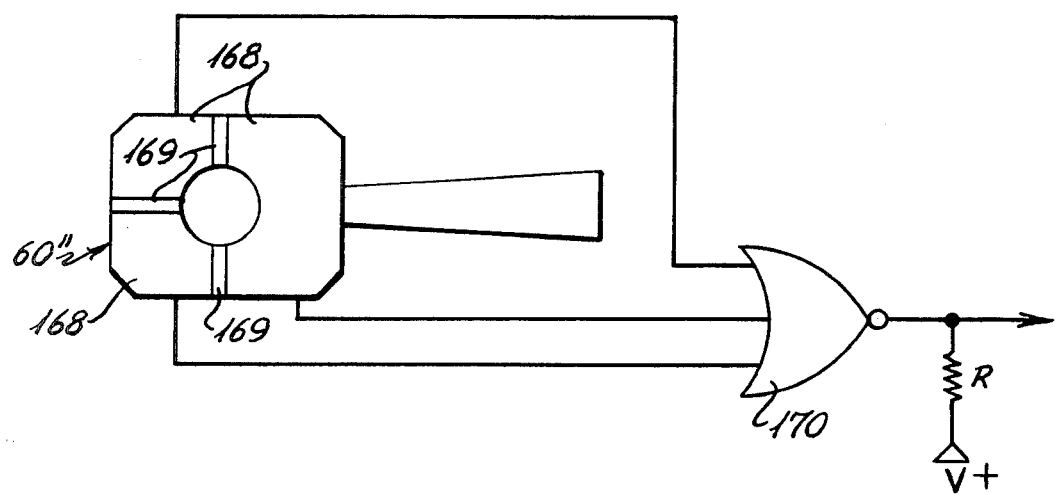
FIG. 48 is a schematic illustration of an alternate embodiment of the instant invention.

FIG. 48 discloses a modified mask 60'' having various conductive segments 168 separated by electrical insulation 169, with each of segments 168 being electrically attached to the input of a logic device 170 (for instance, a NOR gate) such that all of the segments 168 must be in contact with the work surface in order to complete the circuit to the positive voltage source.

When using a probe of the type disclosed in FIG. 3, capacitance changes are indicated, as by a display device of the instrumentation package 4, during approach of the conductive work surface by the probe and prior to proper seating thereof. With the embodiments of FIGS. 46-48, such a readout prior to proper seating of the probe onto the workpiece may be eliminated, since numerous well known circuits may be designed such that gauging of a surface characteristic does not commence until the circuit through Resistor has been completed as described above. Additionally, the plus 5 volts DC may be switched off upon completion of the circuit and prior to such gauging. By using a coating or deposition of conductive material to form mask 60" of FIG. 48, proper seating of the probe onto surfaces of compound curvature may be ensured prior to gauging thereof, thus ensuring that incorrect readings are not obtained.

This concept of sensing proper contact of the probe with the workpiece prior to gauging a characteristic of the surface of the workpiece, such as surface texture, is not limited to the particular type of probes illustrated in the drawings. Rather, this concept could be used with any other various means of measuring a workpiece characteristic and it is intended that the appended claims encompass the method of gauging a surface by the illustrated apparatuses and others.

The probe of the instant invention is constructed to be rugged and durable. The standard probes and most special probes will pass the standard "three-foot drop test" onto a shop floor without damage. Presently produced probes have active sensor areas of 0.005 square inches and larger.

It is to be understood that the present invention is not limited to the preferred embodiments disclosed herein, and that many modifications in construction, arrangement, use and operation are possible within the true spirit of the invention. The present invention is accordingly to be considered as including all such modifications and variations coming within the scope of the appended claims.

I claim:

1. In a method of gauging a predetermined characteristic of an electrically conductive surface by spacing an active sensor area a predetermined distance from an incremental area of said conductive surface and capacitively coupling said active sensor area and said incremental area for said gauging, wherein at least a portion of an electrically conductive material comprises said active sensor area and wherein said incremental area is determined by said active sensor area and provides a gauging capacitance in accordance with said surface characteristic, the improvement comprising the steps of:
electrically sensing when said predetermined distance is attained; and
commensing said gauging only in response to said sensing.

2. The improvement as in claim 1, and further comprising the step of:
providing a dielectric between said active sensor area and said incremental area to at least partially define said predetermined distance.

3. The improvement as in claim 1, and further comprising the step of:
completing an electrical circuit through said conductive surface to implement said sensing.

4. The improvement as in claim 2, and further comprising the steps of:
defining a fixed capacitance value by providing said dielectric between said conductive material and said surface; and
differentiating between said fixed capacitance value and a variable capacitance value to facilitate said gauging,
wherein said variable capacitance value is indicative of said predetermined characteristic.

5. The improvement as in claim 4, and further comprising the steps of:
providing an electrically conductive mask between said conductive surface to be gauged and said dielectric,
wherein said mask is electrically insulated from said conductive material and electrically connectable with said conductive surface; and
defining said active sensor area and masking another portion of said conductive sensor by a configuration of said mask to facilitate said differentiating.

6. The improvement as in claim 5, and further comprising the steps of:
providing an open circuit of which said mask is a portion; and
closing said open circuit through said surface by contacting said mask with said surface to facilitate said sensing.

7. The improvement as in claim 6, and further comprising the steps of:
segmenting said mask and insulating segments thereof one from the other;
providing a logic device in said circuit such that all of said segments must contact said surface to facilitate said sensing.

8. In an apparatus for gauging a predetermined characteristic of an electrically conductive surface by spacing an active sensor area a predetermined distance from an incremental area of said conductive surface and capacitively coupling said active sensor area and said incremental area for said gauging, wherein at least a portion of an electrically conductive material comprises said active sensor area and wherein said incremental area is determined by said active sensor area and provides a gauging capacitance in accordance with said surface characteristic, the improvement comprising:
means for electrically sensing when said predetermined distance is attained; and
means for commensing said gauging only in response to said sensing.

9. The improvement as in claim 8, and further comprising:
a dielectric means situated between said active sensor area and said incremental area for at least partially defining said predetermined distance.

10. The improvement as in claim 8, and further comprising:
means for completing an electrical circuit through said conductive surface to implement said sensing.

11. The improvement as in claim 9, and further comprising:
means for defining a fixed capacitance value;
and means for differentiating between said fixed capacitance value and a variable capacitance value to facilitate said gauging, wherein said variable capacitance value is indicative of said predetermined characteristic.

12. The improvement as in claim 11, and further comprising:
an electrically conductive mask between said conductive surface to be gauged and said dielectric,
wherein said mask is electrically insulated from said conductive material and electrically connectable with said conductive surface and defines said active sensor area and masks another portion of said conductive sensor by a configuration of said mask to facilitate said differentiating.

13. The improvement as in claim 12, and further comprising:
an open circuit of which said mask is a portion; and
means for closing said open circuit through said surface by contacting said mask with said surface to facilitate said sensing.

14. The improvement as in claim 13, and further comprising:
plural segments of said mask electrically insulated one from the other; and
a logic device in said circuit such that all of said segments must contact said surface to facilitate said sensing.

15. The improvement as in claim 11, wherein said fixed capacitance defining means comprises:
said dielectric sandwiched between said conductive material and said surface.

* * * * *